United States Patent
Pascucci

[19]

[11] Patent Number: 6,061,273
[45] Date of Patent: May 9, 2000

[54] PRE-CHARGE STEP DETERMINING CIRCUIT OF A GENERIC BIT LINE, PARTICULARLY FOR NON-VOLATILE MEMORIES

[75] Inventor: Luigi Pascucci, Sesto San Giovanni, Italy

[73] Assignee: SGS-Thomson Microelectronics S.r.l., Agrate Brianza, Italy

[21] Appl. No.: 08/835,347

[22] Filed: Apr. 7, 1997

[30] Foreign Application Priority Data

Apr. 9, 1996 [EP] European Pat. Off. .............. 96830197

[51] Int. Cl.$^7$ ...................................................... G11C 7/00
[52] U.S. Cl. ................... 365/185.25; 365/194; 365/203; 365/210; 365/233.5
[58] Field of Search ................................ 365/203, 233.5, 365/210, 194, 185.25

[56] References Cited

U.S. PATENT DOCUMENTS

| | | | |
|---|---|---|---|
| 5,029,135 | 7/1991 | Okubo | 365/203 |
| 5,083,047 | 1/1992 | Horie et al. | 307/465 |
| 5,210,715 | 5/1993 | Houston | 365/194 |
| 5,404,334 | 4/1995 | Pascucci et al. | 365/233.5 X |
| 5,457,661 | 10/1995 | Tomita et al. | 365/233.5 |

FOREIGN PATENT DOCUMENTS

| | | |
|---|---|---|
| 0 145 357 | 6/1985 | European Pat. Off. . |
| 0 145 488 | 6/1985 | European Pat. Off. . |
| 0 422 939 | 4/1991 | European Pat. Off. . |

OTHER PUBLICATIONS

Patent Abstracts of Japan, vol. 18, No. 89 (P–1692), Feb. 14, 1994 & JP–A–05 290592 (Matsushita Electronics Ind. Co.).

IBM Technical Disclosure Bulletin, vol. 33, No. 4, Sep. 1990, New York, US, pp. 257–258, "Sense Amplifier Set Control".

*Primary Examiner*—Do Hyun Yoo
*Attorney, Agent, or Firm*—Wolf, Greenfield & Sacks, P.C.; James H. Morris; Theodore E. Galanthay

[57] ABSTRACT

A pre-charge step determining circuit of a generic bit line, particularly for non-volatile memories, including in one embodiment, circuitry for simulating the selection/deselection of a generic bit line of a memory device; circuitry for simulating the pre-charging of a bit line; and circuitry for determining when the working point of the bit line is reached; the selection/deselection simulation circuitry activating the pre-charging simulation means, which in turn activate the working point attainment determining circuitry, which generate a pre-charge end signal so as to define a minimal duration of the pre-charging that is closely correlated with the characteristics of the actual selection/deselection and pre-charge circuits of the memory device, with the supply conditions, and with the propagation of a generic bit line, the pre-charge simulation circuitry and the working point attainment determining circuitry being activated synchronously with respect to a new reading cycle of the memory device.

25 Claims, 5 Drawing Sheets

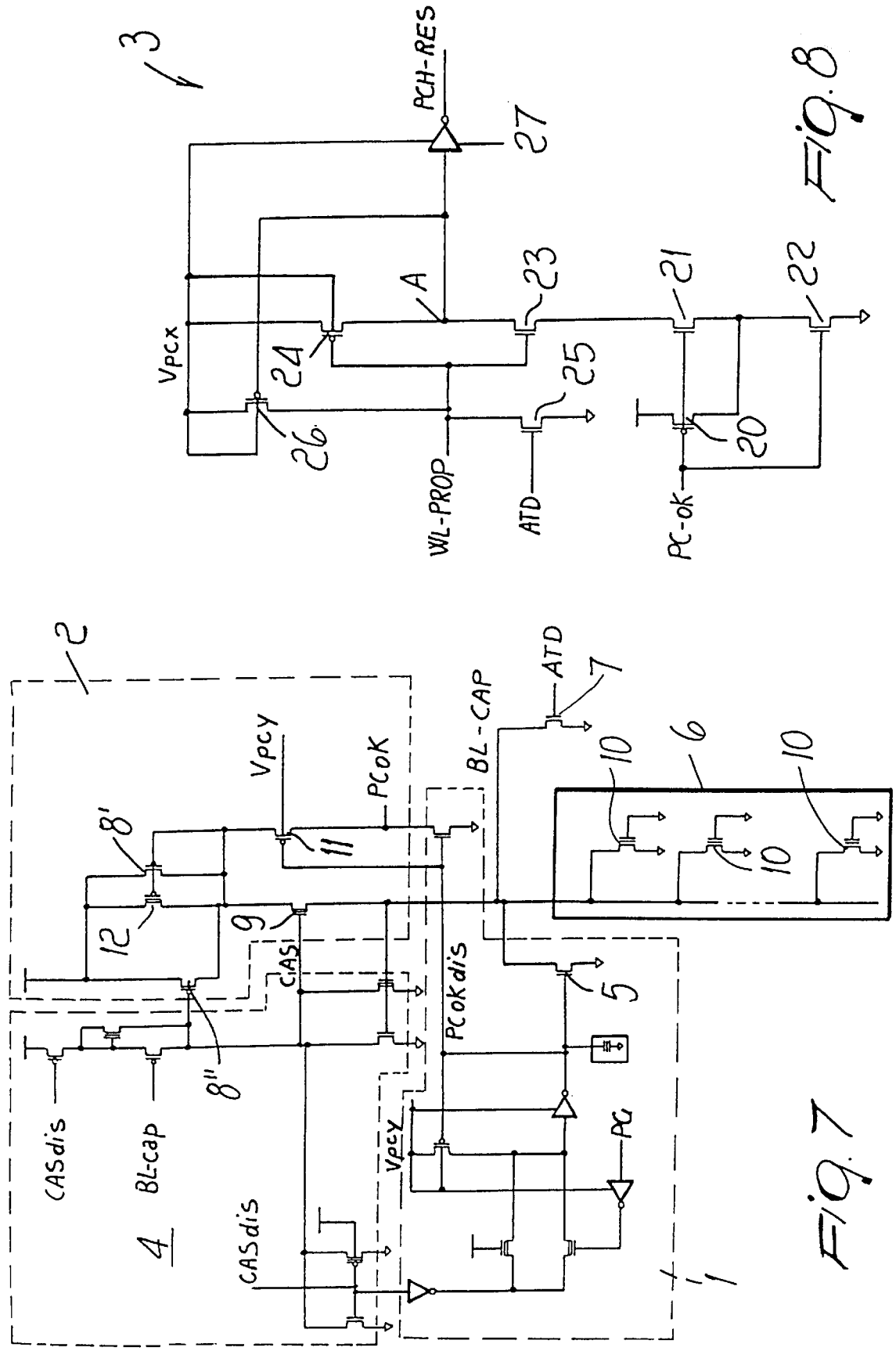

PRE-CHARGE STEP DETERMINING CIRCUIT OF A GENERIC BIT LINE, PARTICULARLY FOR NON-VOLATILE MEMORIES

BACKGROUND OF THE INVENTION

1. Field of the Invention

The present invention relates to a pre-charge step determining circuit of a generic bit line, particularly for non-volatile memories. More particularly, the invention relates to a circuit for determining the minimum duration of the pre-charge step of a bit line.

2. Discussion of the Related Art

In conventional cycles for reading a non-volatile memory, it is customary to provide, in order to improve the reading activity, time steps that are dedicated to the quick pre-charging of the word and bit lines selected for reading, in order to make them reach their working point and then read the data Word lines are notoriously capacitive and therefore slow to pre-charge, whereas bit lines have a different behavior, as regards pre-charging, according to the voltage level used in the memory device.

The pre-charge interval is generally determined by a generic delay network that is often adjustable, or the monitoring of a generic word line propagation is provided for by associating the pre-charging end time with the attainment of a preset level by the line.

A circuit for reproducing the propagation of a generic word line of a memory device to achieve faster reading has been the subject of a patent application in the name of the same Applicant as the present application.

Both approaches mentioned above lack the necessary compliance with the operating conditions of the device and therefore result in the oversizing of the time interval meant for the pre-charging step.

In normal supply voltage conditions, 4.5–5.5 V, the greatest slowing effect is caused by the pre-charging of the word lines, since it is necessary to wait for the signal to propagate alone, the entire line (which has natural resistive and capacitive characteristics), whereas the bit lines can be pre-charged relatively quickly.

The situation changes if the memory device is supplied at a low voltage, 2.7–3 V.

At low voltage, the behavior during word line pre-charging remains substantially unchanged, showing only a small delay with respect to operation at normal voltage; the bit line pre-charging step, however, slows down considerably.

With reference to FIG. 4, which illustrates a sense amplifier of the dynamic latch type for data capture, provided with P-type transistors 12 and 12', for fast pre-charging of the nodes of the matrix branch and of the reference branch (which are interchangeable), pre-charge transistors 12 and 12' in fact deliver, at the normal operating voltage, (i.e., approximately 5V) a pulsed pre-charge current that has a high peak.

The sense amplifier of FIG. 4 has been the subject of a patent application in the name of the same Applicant as the present application.

The curve of the pre-charge current is designated by the reference letter "a" in FIG. 1.

In the case of a low operating voltage, transistors 12 and 12' are no longer able to deliver the high pulsed current (pickup current) that is required to quickly trigger pre-charging; therefore, the curve of the pre-charge current changes from curve "a" to curve "b", also shown in FIG. 1.

In this manner, the bit lines are affected by this decrease in current and pre-charge much more slowly.

Therefore, a drawback of this situation is the fact that the factor that limits the pre-charging speed, and therefore the reading speed, of the memory device is now constituted by the behavior of the pre-charging of the bit line.

The chart of FIG. 2 shows, in a Cartesian system whose ordinates plot the current of a memory cell and whose abscissae plot the voltage at the drain terminal of the cell, two curves of the cell current Icell, in case of 5-V voltage (curve "c") and in the case of low voltage, 2.7 V (curve "d").

FIG. 3 instead plots voltages as a function of time and shows the curves that indicate the pre-charging of a generic word line and of a generic bit line in two different voltage conditions, at normal voltage and at low voltage.

The curves "e" and "f" relate respectively to the pre-charge curve of a word line and a bit line, with a voltage equal to 5 V, whereas the curves "g" and "h" relate respectively to the pre-charge curve of a word line, and a bit line with a voltage of 2.7 V.

FIG. 3 indicates, for the various lines, the respective delays that affect them before reaching the working point, starting from the time $t_0$, which corresponds to the origin of the axes.

The expression $\Delta t_1$ references the delay that affects the bit line "f" at 5 V and $\Delta t_2$ references the delay that affects the word line at the same voltage. It is evident that, at the higher voltage the word line has a greater delay than the bit line, i.e., it has a slower pre-charging.

The reverse case occurs at the lower voltage. The expression $\Delta t_3$ references the delay that affects the word line "g" at low operating voltage and $\Delta t_4$ references the delay that affects the word line "h", again at low voltage.

Therefore, the graph clearly shows that at the lower voltage it is the bit line that slows the reading of the memory device, because its pre-charging is slower than that of the word line.

The cell current during the pre-charge step of the bit line runs the risk of being confused, by overlap, with the pre-charge current of the bit line, shown by the curve "b" in FIG. 1, since the latter has a very similar development because it has lost its pulsed characteristic (with a high peak).

The pre-charge interval that must be selected (with reference again to FIG. 3) to ensure pre-charging of the various lines, therefore, cannot be determined unequivocally so as to meet all possible operating voltages.

Since different behaviors of the word lines and of the bit lines occur at different voltage values, it is necessary to take both of these variables into account in order to determine a pre-charge time interval that is valid in any operating condition and that is not oversized so as to assuredly comply with all possible behaviors of the lines.

SUMMARY OF THE INVENTION

The aim of the present invention is therefore to provide a pre-charge step determining circuit of a generic bit line, particularly for non-volatile memories, that allows the reduction to an assured minimum value the time interval dedicated to pre-charging a bit line for subsequent reading.

Within the scope of this aim, an object of the present invention is to provide a pre-charge step determining circuit of a bit line that allows automatic link up of the pre-charge interval to the real operating conditions of the power supply system that are present at a given instant in a memory device.

Another object of the present invention is to provide a pre-charge step determining circuit of a generic bit line that allows synchronization of the activation of the pre-charge step of a bit line with the beginning of a reading cycle.

Another object of the present invention is to provide a pre-charge step determining circuit of a bit line that allows reproduction of the pre-charge time of a bit line in order to determine its end.

Another object of the present invention is to provide a pre-charge step determining circuit of a bit line that allows taking into account, in all conditions, the selection/deselection propagations of a generic bit line.

Another object of the present invention is to provide a pre-charge step determining circuit of a bit line that allows minimization of the step for the forced equalization of two bit lines, a reading line and a reference line, that are compared.

Another object of the present invention is to provide a pre-charge step determining circuit of a bit line that allows linkup of the duration of the pre-charge step to the characteristics of the devices that are used.

Another object of the present invention is to provide a pre-charge step determining circuit of a bit line that allows stimulation of the operating conditions of a bit line to assuredly determine its pre-charge step.

Another object of the present invention is to provide a circuit that is highly reliable and relatively easy to manufacture at competitive costs.

This aim, these objects, and others that will become apparent hereinafter are achieved by a pre-charge step determining circuit of a generic bit line.

According to one aspect of the present invention, a pre-charge step determining circuit includes means for simulating the selection/deselection of a generic bit line of a memory device, means for simulating the pre-charging of a bit line, and means for determining when the working point of the bit line is reached. The selection/deselection simulation means activate the pre-charging simulation means, which in turn activate the working point attainment determining means. The working point determining means generate a pre-charge end signal so as to define a minimal duration of the pre-charging that is closely correlated with the characteristics of the actual selection/deselection and pre-charge circuits of the memory device, with the supply conditions, and with the propagation of a generic bit line. The pre-charge simulation means and the working point attainment determining means are activated synchronously with respect to a new reading cycle of the memory device.

According to another aspect, a pre-charge step determining circuit of a generic bit line of a memory device includes a selection/deselection simulation circuit, a pre-charging simulation circuit and a working point determination circuit. The selection/deselection simulation circuit is configured to simulate selection/deselection of the generic bit line of the memory device. The pre-charging simulation circuit is configured to simulate pre-charging of a bit line, the pre-charging simulation circuit being activated by the selection/deselection simulation circuit. The working point determination circuit is configured to determine when a working point of the bit line is reached, the working point determination circuit being activated by the pre-charging simulation circuit and generating a pre-charge end signal so as to define a minimal duration of pre-charging that is closely correlated with characteristics of actual selection/deselection and pre-charge circuits of the memory device and with propagation of the generic bit line.

According to another aspect of the invention, a circuit for determining whether a preset working point has been reached for a generic bit line of a memory device, for use in a circuit for determining a pre-charge step of the generic bit line, includes a first inverter and a structure for checking that propagation on the generic bit line has occurred. The first inverter receives in input a signal indicating completion of propagation on a generic word line that is interposed between an actual supply voltage of the memory device and ground. The structure for checking that propagation on the generic bit line has occurred is interposed between the first inverter and the ground, the inverter emitting the pre-charge step end signal when propagation signals of the bit line and of the word line are present simultaneously.

According to yet another aspect, a method for determining a pre-charge interval of a generic bit line of a memory device, particularly for non-volatile memories, includes the steps of: (a) synchronously with an address transition signal that sets a beginning of a reading cycle, simulating delays introduced by selection/deselection of the generic bit line of the memory device; (b) activating simulation of pre-charging of the generic bit line; and (c) determining when a working point of the generic bit line is reached, so as to define a minimum duration for the pre-charging in correlation with propagation times along the generic bit line.

BRIEF DESCRIPTION OF THE DRAWINGS

FIG. 7 is a detailed circuit diagram of the first portion of the circuit according to the invention shown in FIG. 6;

FIG. 8 is a detailed circuit diagram of a second portion of the circuit according to the invention shown in FIG. 5;

DETAILED DESCRIPTION

Figure 1:
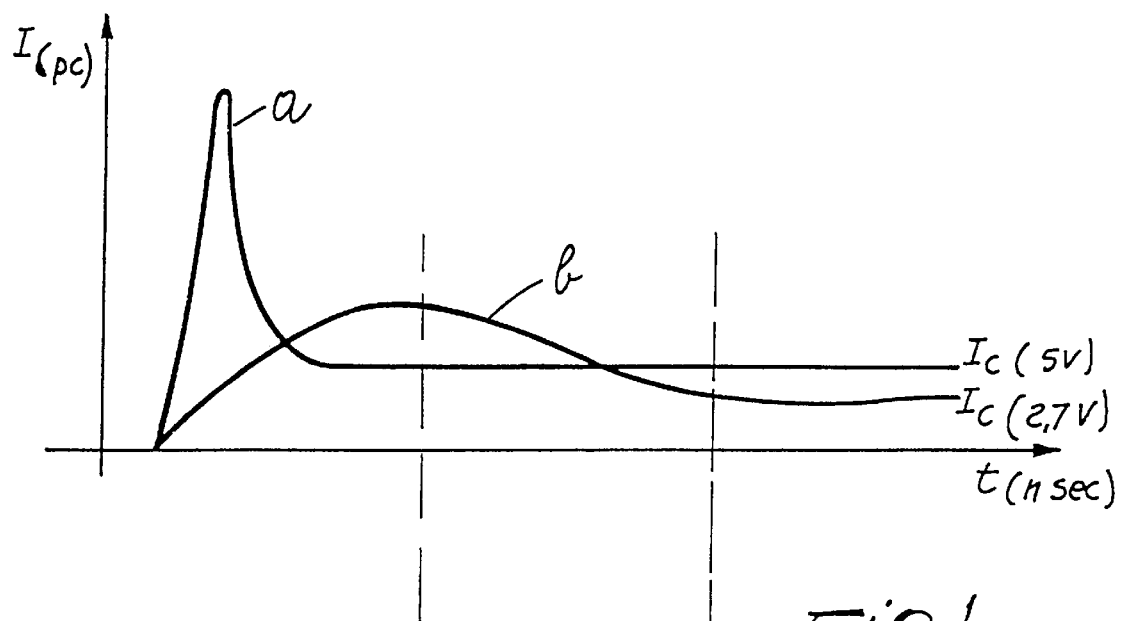
FIG. 1 is a graph that plots two different developments of the pre-charge current at two different supply voltage values.
Figure 3:
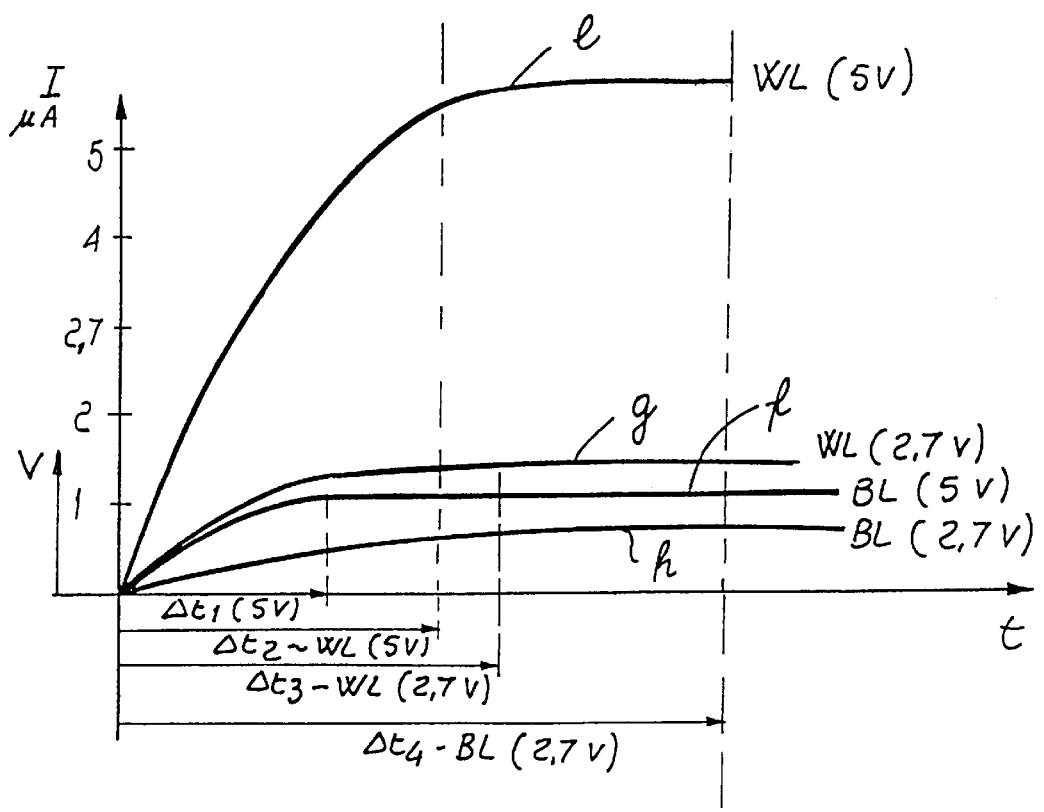
FIG. 3 is a graph that plots voltage curves for word lines and bit lines as a function of time at two different supply voltage levels.
Figure 2:
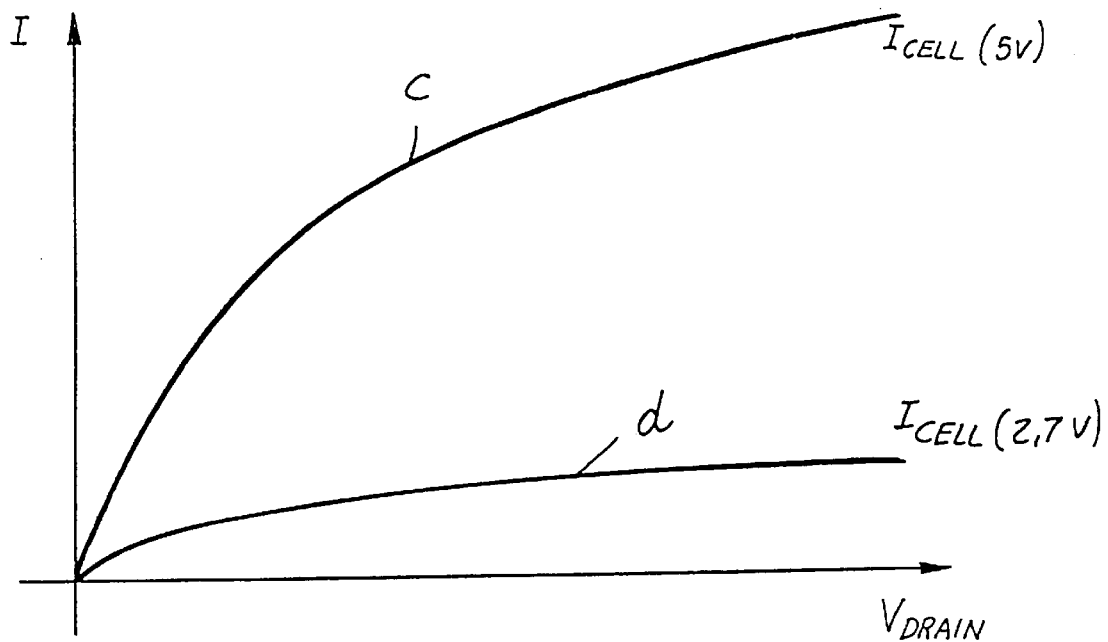
FIG. 2 is a graph that plots two curves related to the current of a memory cell as a function of the supply voltage.
Figure 4:
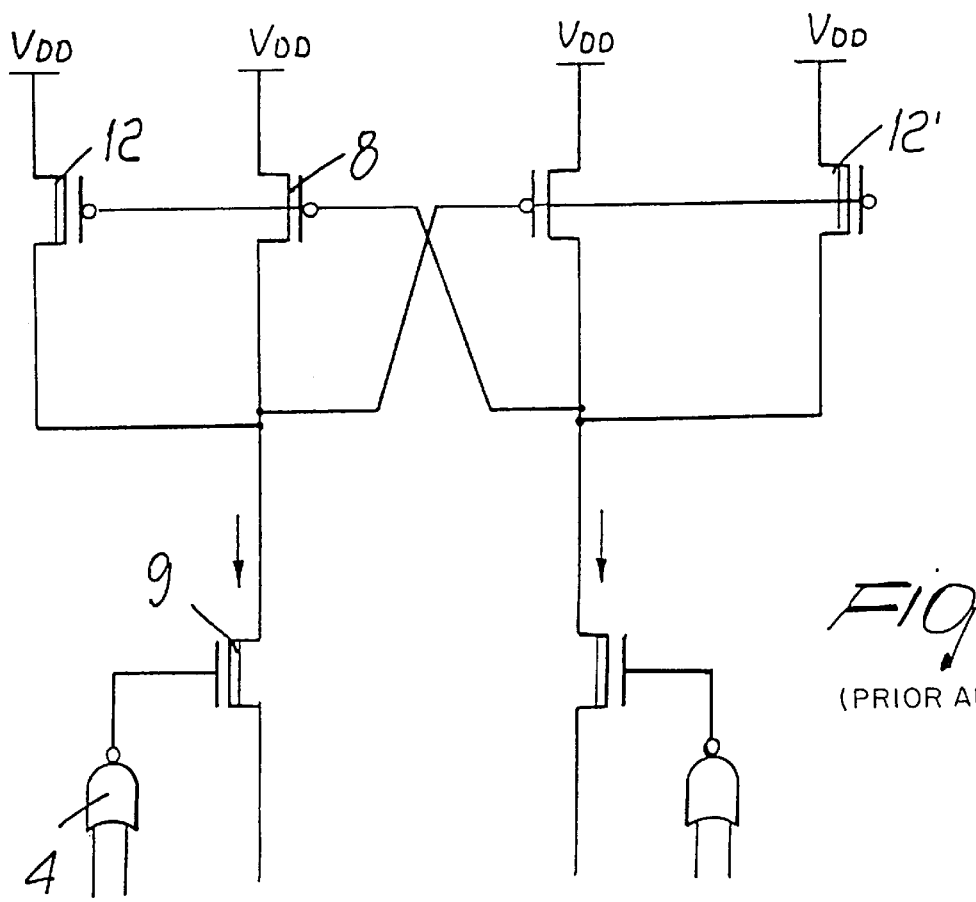
FIG. 4 is a view of pre-charging means of a sense amplifier of the latch type.
Figure 5:
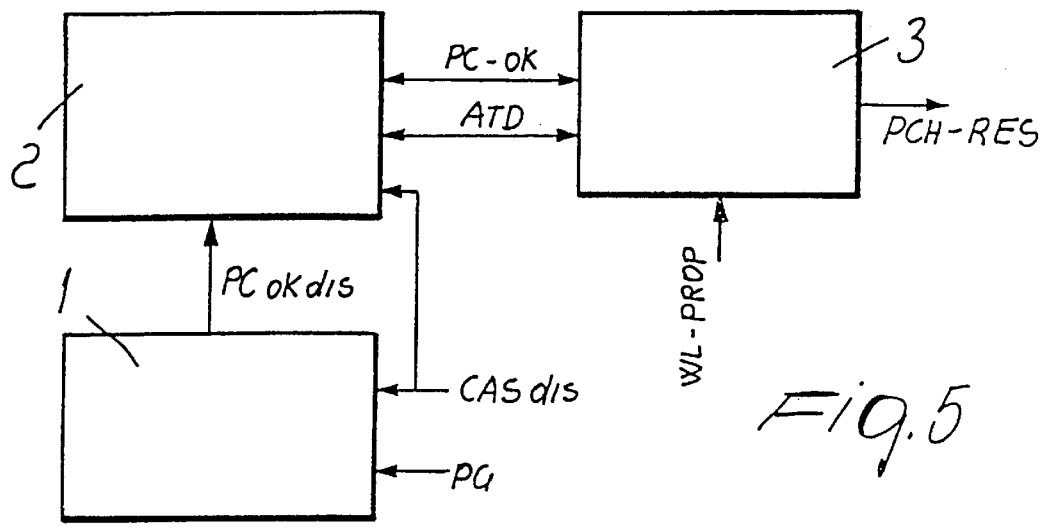
FIG. 5 is a block diagram of a circuit according to the invention.

With reference to FIGS. 4–10, and first of all to FIG. 5, a circuit according to the invention comprises: circuit 1 for simulating the selection of a bit line, which are is adapted to simulate the selection/deselection characteristics of a generic bit line of a memory device; circuit 2 for simulating the pre-charging of a generic bit line; and circuit 3 for determining the attainment of the working point that is preset for a generic bit line, which is adapted to detect working point attainment and to then trigger the reading circuits of the memory device.

Selection simulation circuit 1 receives an input signal CASdis for disabling the biasing structure and a programming signal PG.

The output of selection simulation circuit 1 is a pre-charge enabling/disabling signal PCokdis, which is sent to pre-charge simulation circuit 2 together with the signal CASdis.

Pre-charge simulation circuit 2 also receives an input signal ATD (Address Transition Detection) for detecting the transition of the read address of the memory device.

The output of pre-charge simulation circuit 2 is a signal PC-OK, which is sent to circuit 3 for determining the working point of a generic bit line, which receives the input signal ATD and a signal for detecting propagation along a word line WL-PROP.

Working point detection circuit 3) therefore produces an output signal PCH-RES for ending the pre-charge interval when the working point is reached by the bit line involved in the reading operation.

Figure 6:
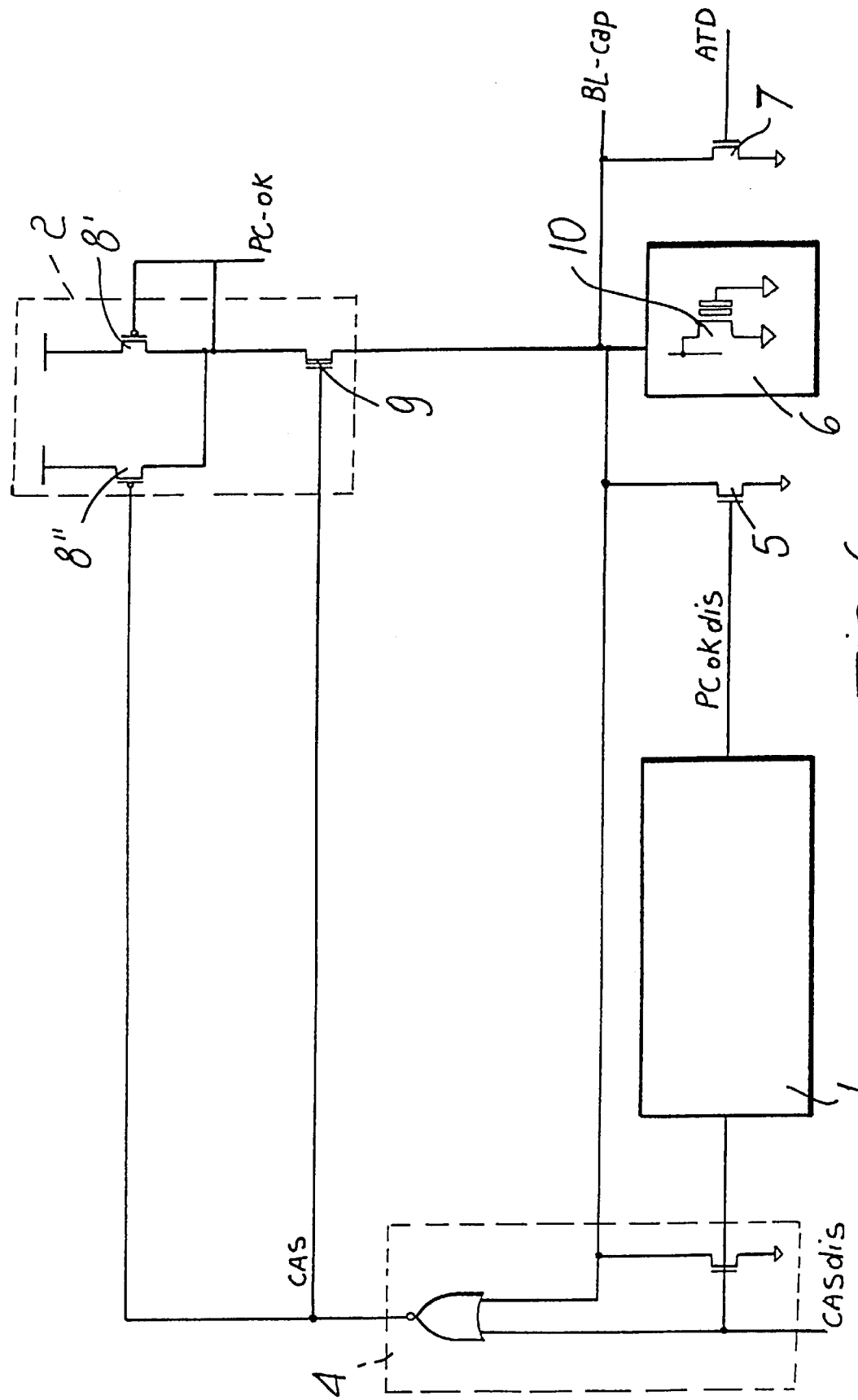
FIG. 6 is a circuit diagram, partially in block form, of a first portion of the circuit according to the invention shown in FIG. 5.

With reference now to FIG. 6, the circuital details of selection simulation circuit 1 of a generic bit line and pre-charge simulation circuit 2 are shown.

Circuits 1 and 2 reproduce the selection/deselection structures and the loads that are connected thereto, as well as the pre-charge timing of a line, so as to provide a timing match with a real selection event and a reproduction thereof.

In detail, circuit 1 comprises a circuit for simulating the selection/deselection of a generic bit line, whose structure and size is similar to that of an actual selection/deselection circuit. Said circuit receives the programming signal PG and emits the signal PCokdis for enabling/disabling the pre-charging of a bit line; this signal is sent to pre-charge simulation circuit 2, which is adapted to generate a pre-charge signal PC-OK that is sent to circuit 3 for determining attainment of the working point of the bit line.

The signal PCokdis output from selection/deselection simulation circuit 1 is provided to the gate terminal of an N-channel transistor 5 that is interposed between the common node of a plurality of drain terminals of memory cells that belong to a dummy bit line 6, whose structure and size reproduce a generic bit line of a memory device, and the ground.

The gate terminals of each memory cell of the dummy bit line 6 are connected to the ground.

The common node of the drain terminals of the cells is designated by BL-CAP. An N-channel transistor 7 is interposed between said node and the ground, and its gate terminal receives the signal ATD for synchronizing the operation of the device according to the invention with the beginning of a new memory reading cycle and to quickly restore the initial conditions.

A biasing structure 4, shown in FIG. 6 as comprising a NOR gate, receives the signal CASdis and emits a signal CAS.

The pre-charge simulation circuit 2 comprises a first transistor 8' of the P-channel type that belongs to a branch of the latch-type sense amplifier shown in FIG. 4. In FIG. 4, the reference numeral 8 designates the P-type transistor that corresponds to the one designated by 8' in FIG. 6.

It is optionally possible to add a transistor 8", also of the P-channel type, and to decrease the size of transistor 8' by a value that is equal to the size of transistor 8", so that the sum of the sizes of transistors 8' and 8" of FIG. 6 equals the size of transistor 8 of FIG. 4.

The pre-charge simulation circuit 2 also comprises a transistor 9 of the native N-channel, low-threshold type, which is adapted to allow connection between pre-charge simulation circuit 2 and dummy bit line 6.

The signal CAS (output from the biasing structure 4) is sent to the gate terminal of transistor 9.

FIG. 7 shows, in greater detail, selection/deselection simulation circuit 1 of a bit line, pre-charge simulation circuit 2, and biasing structure 4.

In this case, biasing structure 4 is provided as a cascode structure, described in EPA no. 95830357 in the name of the same Applicant as the present application, which is incorporated herein by reference. Accordingly, cascode structure 4 will not be explained in detail.

FIG. 7 shows that selection/deselection circuit 1 of a bit line is supplied at the supply voltage VPCY. Dummy bit line 6 is shown with a plurality of memory cells 10 connected thereto; said memory cells being comprised of N-channel floating gate transistors.

Pre-charge simulation circuit 2 of a generic bit line (represented by dummy bit line 6) comprises, in addition to what is described in FIG. 6, a pre-charge transistor 12 of the native P-channel high-threshold type, parallel-connected to transistor 8', for the fast pre-charging of the bit line (transistor 12 is also shown in FIG. 4), and an additional P-channel transistor 11 whose source terminal is connected to the gate terminal of transistor 8' and whose gate terminal receives the signal PCokdis.

The body of transistor 11 is at the voltage VCPY of bit line selection circuit 1.

FIG. 8 shows circuit 3 for determining when the working point of a bit line has been reached, in order to produce a pre-charge end signal PCH-RES for a new read cycle. Signal PCH-RES therefore determines the duration of the pre-charge interval.

Circuit 3 comprises a first transistor 20 of the P-channel type, whose source terminal is connected to the supply voltage VPCX (which represents the actual supply voltage of the memory device, which can be $V_{DD}$ or a boost voltage), and whose gate terminal receives the signal PC-OK.

The signal PC-OK is also sent in input to the gate terminals of transistors 21 and 22. Transistor 21 is of the N-channel type and its source terminal is connected to the drain terminal of transistor 20 and to the drain terminal of transistor 22 (N-channel transistor).

The source terminal of transistor 22 is connected to the ground.

The drain terminal of transistor 21 is connected to the source terminal of an N-channel transistor 23 that is part of a CMOS inverter, whose second transistor is a P-channel transistor 24.

Transistors 23 and 24 are common-drain connected.

The word line propagation signal WL-PROP is sent to the gate terminals of transistors 23 and 24.

The source terminal of transistor 24 is connected to the supply voltage VPCX and so is its body. The supply voltage VPCX is equal to, or higher than, $V_{DD}$.

An N-channel transistor 25 receives the signal ATD to its gate terminal and is connected to the ground with its source terminal and to the line that carries the signal WL-PROP with its drain terminal.

The drain terminals of transistors 21 and 23 are connected to an inverter 27 (constituted by two N-channel and P-channel transistors, not shown), which outputs the signal PCH-RES.

The P-type transistor of inverter 27 is connected to the supply voltage VPCX with its source terminal.

A P-channel transistor 26 is interposed between the supply voltage and the line that carries the signal WL-PROP, and its gate terminal is connected to the input of inverter 27. The body terminal of transistor 26 is also connected to the supply voltage.

Figure 9:
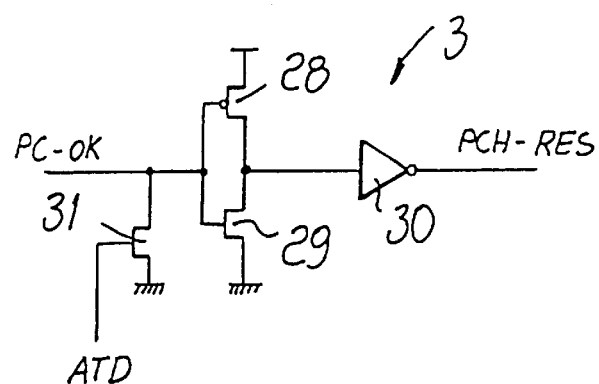
FIG. 9 is a view of a second embodiment of the second portion of the circuit according to the invention shown in FIG. 8.

FIG. 9 illustrates a second simplified embodiment of working point attainment determining circuit 3.

In this second embodiment, the signal PC-OK is sent to the gate terminals of two transistors 28 and 29, respectively of the N-channel and P-channel types, which form a CMOS inverter that is connected between the supply voltage and the ground.

The output of the inverter, taken at the common-drain connection of transistors 28 and 29, is sent to an inverter 30, whose output is the signal PCH-RES.

An additional N-channel transistor 31 receives the signal ATD, at its gate terminal; its source terminal is connected to the ground and its drain terminal is connected to the line that carries the signal PC-OK.

Figure 10:
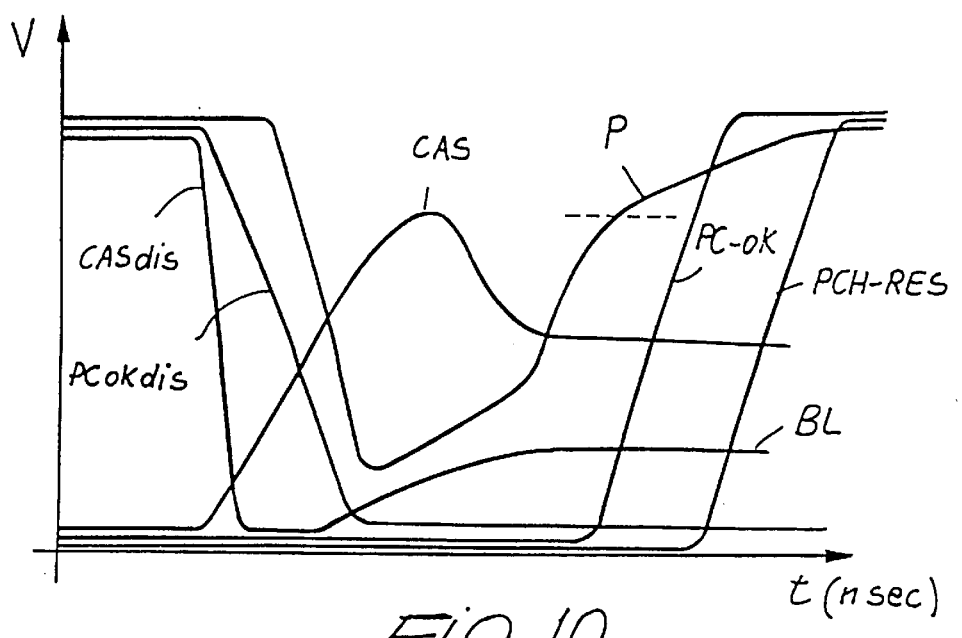
FIG. 10 is a graph that plots the temporal development of the various signals of the circuit according to the invention shown generally in FIG. 5.

FIG. 10 plots the curves of various signals of the circuit according to the invention and will be explained hereinafter with reference to the operation of the circuit.

With reference to FIGS. 5–10, the operation of the circuit according to the invention is as follows.

Circuit 1 for simulating the selection/deselection of a generic bit line reproduces the structure and size, with the corresponding delays, of a bit line selection multiplexer; pre-charge simulation circuit 2 simulates, in terms of structure and size, the pre-charge circuits of a generic bit line. Circuit 1 and circuit 2 of the circuit according to the invention can be modified to precisely reproduce the circuital structures that are actually used in the memory device.

Circuit 1 for the selection/deselection of a generic bit line produces the signal PCokdis, which is correlated with the delays of the selection/deselection of the generic bit line, so as to output an assured indication of the end of the selection of a bit line. Therefore, if the signal PCokdis is high, then the selection of the bit line has not ended yet and bit line pre-charge simulation circuit 2 must not be activated.

Then, if PCokdis is high, transistor 5 is on and therefore the path to the ground is activated, interrupting the connection to pre-charge simulation circuit 2.

Initially, node CAS of the circuit of FIG. 7 is low and remains low throughout the duration of a pulse of ATD (CASdis becomes active only at the end of the pulse of ATD), like the actual pre-charge circuit, and the signal PC-OK is kept at ground value, so as to avoid activating the working point attainment determining circuit 3 and to avoid interrupting the pre-charge step, since the generic bit line has not yet been pre-charged fully.

Initially, node P of the circuit of FIG. 7 is high (when not in read mode), and the capacitor of bit line 6 is drained since the node BL-CAP is kept at the ground value.

When CASdis assumes the ground value, at the end of the pulse of ATD, i.e., when reading is simulated, biasing structure 4 is released and the signal PCokdis, which is initially high, keeps node BL-CAP at the ground value.

After the selection step performed by circuit 1, bit line 6 pre-charges and node P reaches the ground value. When PC-OKdis becomes zero, bit line 6 is released and the voltage on node P rises; when it reaches a certain set level (trigger level), the bit line is pre-charged.

It should be noted that P-channel transistors 8' and 8" equal, as a whole, the size of the devices used in the actual sense amplifier of the memory. One portion, transistor 8", is connected to the node CAS. This achieves two functions:

a) it allows attainment of the full level of the power supply, which is otherwise impossible; and b) in low-voltage conditions, due to the dynamic over-elongation of node CAS, transistor 8" does not take part directly in the pre-charging of the bit line (because it is off), thus ensuring that a small margin is provided which allows even the slowest line of a natural distribution of lines to be taken into account.

The high output signal PC-OK indicates completion of pre-charging.

If an address transition occurs during a step for selecting the bit line, the high signal ATD switches on transistor 7 and returns node BL-CAP immediately to the ground value (and also CASdis, which helps to reinforce this characteristic), reestablishing the initial conditions.

Working point attainment determining circuit 3 is deactivated immediately and

Working point attainment determining circuit 3 shown in FIG. 9 allows the generation of a pre-charge end signal that is correlated only with the pre-charging of the bit line (with synchronization of the signal ATD), without, however, taking word line propagation into account.

The circuit shown in FIG. 8 takes word line propagation into account as well and is therefore a more accurate means for determining the attainment of the working point for ending pre-charging. In the case of a low operating voltage, the fact of correlating the duration of pre-charging with the bit line alone would not entail a disadvantage, since word line propagation is faster than the propagation of a bit line and therefore the limiting factor is indeed the latter.

Instead, if the operating voltage is normal, i.e., not a low operating voltage, as described above, propagation along the word line slows considerably more than the bit line, and therefore failure to take into account its propagation would entail an evaluation error in determining the duration of the pre-charge step.

In this second case, and generally if one wishes to have a circuit that is valid for any operating voltage, the circuit of FIG. 8 should be employed.

The circuit of FIG. 8 is a coincidence circuit, since it waits to generate the end signal PCH-RES until both WL-PROP and PC-OK are high, i.e., until the propagations both on the word line and on the bit line of the memory device, always in synchronization with the signal ATD, have occurred.

The signal PC-OK starts low and is sent to working point attainment determining circuit 3. At this point, transistor 20 is on and transistors 21 and 22 are off. In this manner, node A is high at VPCX ($V_{DD}$ or higher), since there is no path to the ground.

The signal WL-PROP also starts low (and is produced by an appropriate network for reproducing the propagations of a word line, not shown) and therefore node A is at the supply voltage VPCX (which can be $V_{DD}$ or boost).

If WL-PROP becomes high, transistor 23 switches on and transistor 24 switches off. However, node A cannot discharge, since PC-OK is still low and the path to the ground is interrupted (biased to $V_{DD}$ by transistor 20).

When PC-OK becomes high (propagation has occurred on the bit line), transistor 20 switches off, whereas transistors 21 and 22 switch on, enabling the path to the ground for node A, which discharges and allows the generation of the high signal PCH-PES. In this manner, pre-charging is halted.

It may occur that PC-OK is instead the first signal to become high. In this case, transistor 20 switches off and transistors 21 and 22 switch on, connecting the path to the ground, but node A remains high, because transistor 23 is off (since WL-PROP=0).

When the signal WL-PROP becomes high, node A can discharge to the ground, since transistor 23 switches on.

The transistor 21 acts as a decoupler between the voltage VPCX and the supply voltage $V_{DD}$ that is present at the source terminal of transistor 20; this is an important function when VPCX>$V_{DD}$.

Transistor 26 has the purpose of providing a trigger effect (which is useful to make its necessarily slow path monotonic in case of noise) for the circuit of FIG. 8. Transistor prevents the triggering of the signal PCH-RES from switching back to zero immediately after its initial switching to the high level.

In practice, transistor 26 sets a second trigger level for the circuit of FIG. 8, above which the signal PCH-RES does not switch back to a low value. This effect is provided by producing a feedback on the output of the inverter formed by transistors 23 and 24.

This ensures precise switching, without oscillations, of the output signal PCH-RES.

The behavior of the various signals of the circuit according to the invention is shown in FIG. 10, wherein BL designates the generic bit line.

The horizontal dashed line indicates the triggering point (trigger effect) due to transistor 26.

In practice, it has been observed that the circuit according to the invention fully achieves the intended aim, since it allows an assured determination of the minimum time interval to be dedicated to the pre-charging of a generic bit line of a memory device, so as to trigger memory reading activities.

This occurs in close correlation with the supply voltage that is actually present in the memory device at reading time and also in close correlation with the characteristics of the devices.

The advantage that arises from the assured determination of an "appropriate" (minimum) pre-charging interval leads to an increase in the reading speed of the memory device, which thus adapts to the different possible operating conditions and always provides its best possible performance.

The synchronization of the signal ATD allows linkup of the operation of the device according to the invention to the actual start of a new memory read cycle.

This refinement allows the quick restoration of the initial conditions.

The circuit has an asymmetrical behavior: it follows the actual propagations of the memory device with the same timing, but it quickly restores the initial conditions of all its parts.

Determination of a minimum pre-charge interval allows reduction to the smallest necessary value the forced equalization of the bit lines compared for reading (an operation which is in any case essential to eliminate any difference that can be linked to the previous reading cycle), i.e., the bit line to be read and its corresponding reference bit line. In this manner, a longer time interval is left for producing a signal at the level of the bit lines after the release of forced equalization.

The provision, in the circuit according to the invention, of exact duplicates of the circuits used in the memory device allows linkage of the operation of the device to the actual power supply condition and to the technology of the memory device and allows quick updating of the circuit according to the invention following a change in the characteristics of the read circuits of the memory device.

Likewise, the load of the bit line is also reproduced with the number of memory cells that are actually connected to the generic bit line of the memory device; the gate terminal of each cell being connected to the ground.

The device thus comprised is susceptible of numerous modifications and variations, all of which are within the scope of the inventive concept.

Thus, for example, circuit 1 for simulating the selection/deselection of a generic bit line and circuit 2 for simulating the pre-charging of a generic bit line, shown in FIGS. 6 and 7, can be modified so as to reproduce every possible different implementation adopted for the selection/deselection means and the pre-charging means actually used in a memory device.

Furthermore, cascode structure 4 shown in FIG. 7 is only an example of a biasing structure, since it is possible to use any biasing structure, such as, for example, the generic NOR gate shown in FIG. 6, for the memory device. Of course, in this case, in the circuit according to the invention, it is necessary to repeat the exact duplicate of the biasing structure that is actually used.

Furthermore, all the details may be replaced with other technically equivalent elements.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A pre-charge step determining circuit of a generic bit line of a memory device, particularly for non-volatile memories, including a plurality of bit lines wherein fewer than all of the plurality of bit lines can be selected for pre-charging during a given pre-charge interval, the circuit comprising:

means for simulating selection/deselection of the generic bit line of the memory device which is to be pre-charged during a pre-charge interval of the memory device, the generic bit line being selected/deselected from among the plurality of bit lines;

means for simulating pre-charging of a bit line, said pre-charging simulation means being activated by said selection/deselection means; and means for determining when a working point of said bit line is reached, said working point determining means being activated by said pre-charging simulation means and generating a pre-charge end signal so as to define a minimal duration of pre-charging that is closely correlated with characteristics of actual selection/deselection and pre-charge circuits of the memory device, with supply conditions, and with propagation of a generic bit line in the memory device, said pre-charge simulation means and said working point determining means being activated synchronously with respect to a new reading cycle of the memory device.

2. The circuit according to claim 1, wherein a structure and size of said means for simulating the selection/deselection of the generic bit line are similar to those of an actual selection/deselection circuit of the generic bit line of the memory device.

3. The circuit according to claim 1, wherein said means for simulating the pre-charge of the generic bit line of the memory device has a structure that is similar to that of an actual pre-charge circuit of the memory device.

4. The circuit according to claim 1, wherein said pre-charge simulation means comprises a dummy bit line that is identical to the generic bit line of said memory device and a network for reproducing the pre-charge circuits of said memory device.

5. The circuit according to claim 4, wherein said pre-charge simulation means includes, for reproduction of the pre-charge circuits, the same pre-charge circuits as a bit line of a bit device, said pre-charge circuits being smaller than actual pre-charge circuits of the bit line.

6. The circuit according to claim 4, wherein said pre-charge simulation means comprises, for reproducing the pre-charge circuits, the same pre-charge circuits as a bit line of a bit device, said pre-charge circuits being smaller than the actual pre-charge circuits of the bit line, said pre-charge simulation means having an additional transistor to increase a level of a pre-charge voltage to a full level of a supply voltage and to take into account propagation of a slowest bit line of the memory device.

7. The circuit according to claim 1, wherein said selection/deselection simulation means and said pre-charge simulation means receive in input an enabling/disabling signal.

8. The circuit according to claim 1, wherein said pre-charge simulation means generates a signal for enabling/disabling the pre-charging of said pre-charge simulation means.

9. The circuit according to claim 1, wherein said pre-charge simulation means generates a signal for enabling said working point attainment determining means of said bit line.

10. The circuit according to claim 1, wherein said pre-charge simulation means receives in input a propagation signal of a generic word line of said memory device to link a generation of said pre-charge end signal, so as to interrupt pre-charging, to propagation conditions of the generic word line.

11. The circuit according to claim 1, wherein said working point attainment determining means of said bit line are supplied by an actual supply voltage of said memory device, so as to correlate generation of said pre-charge end signal with said actual supply voltage.

12. The circuit according to claim 1, wherein:

the memory device is supplied by a plurality of supply voltages; and said working point determining means of said bit line is supplied by an actual supply voltage, among said plurality of supply voltages, of said memory device, so as to correlate generation of said pre-charge end signal with said actual supply voltage.

13. The circuit according to claim 1, wherein the pre-charge simulation means is activated in response to receiving an indication that the selection/deselection simulation means has completed its simulation of the selection/deselection of the generic bit line which is to be pre-charged.

14. A method for determining a pre-charge interval of a generic bit line of a memory device, particularly for non-volatile memories, including a plurality of bit lines wherein fewer than all of the plurality of bit lines can be selected for pre-charging during a given pre-charge interval comprising the steps of:

synchronously with an address transition signal that sets a beginning of a reading cycle, simulating delays introduced by selection/deselection of the generic bit line of the memory device which is to be pre-charged during a pre-charge interval of the memory device, the generic bit line being selected/deselected from among the plurality of bit lines;

activating simulation of pre-charging of said generic bit line; and monitoring the simulation of the pre-charging of the generic bit line to determine when a working point of said generic bit line is reached, so as to define a minimum duration for said pre-charging, in correlation with propagation times along said generic bit line.

15. The method according to claim 14, wherein said step for determining whether the working point of said generic bit line has been reached in order to determine the minimum duration for said pre-charging is performed in correlation with a signal for determining propagation along a generic word line to which said generic bit line is connected.

16. The method according to claim 14, further comprising a step of quickly restoring initial conditions that were present before an occurrence of an address transition signal, as a consequence of an occurrence of a subsequent address transition signal that immediately follows a first address transition signal.

17. The method according to claim 14, wherein the memory device is supplied by a plurality of supply voltages, and wherein the step of monitoring the simulation of the pre-charging of the generic bit line includes a step of:

using an actual supply voltage of the memory device, among said plurality of supply voltages, as a factor in determining when the working point of the generic bit line is reached, so as to define the minimum duration for said pre-charging, in correlation with the actual supply voltage of said memory device.

18. The method according to claim 14, wherein the step of activating simulation of the pre-charging of said generic bit line is performed in response to receiving an indication that the step of simulating delays introduced by the selection/deselection of the generic bit line of the memory device has been completed.

19. A circuit for determining whether a preset working point has been reached for a generic bit line of a memory device, for use in a circuit for determining a pre-charge step of the generic bit line, comprising:

a first inverter, which receives in input a signal indicating completion of propagation on a generic word line, that is interposed between an actual supply voltage of said memory device and ground, and a structure for checking that propagation on the generic bit line has occurred, said checking structure being interposed between said first inverter and the ground, said inverter emitting a pre-charge step end signal when propagation signals of the bit line and of the word line are present simultaneously.

20. The circuit according to claim 19, further comprising a second inverter that is cascade-connected to said first inverter and is supplied at the same actual supply voltage as said first inverter, said second inverter emitting in output the pre-charge step end signal.

21. The circuit according to claim 19, wherein said structure for checking that propagation has occurred on the generic bit line comprises a first transistor of a first polarity connected between said first inverter and a second transistor of a first polarity, which is in turn connected to the ground, and a third transistor of a second polarity, which is interposed between the supply voltage and a source terminal of said first transistor, said first, second, and third transistors receiving in input the signal indicating that propagation has occurred along said generic bit line.

22. The circuit according to claim 19, further comprising a control transistor of a first polarity that is driven by a read address transition signal, said control transistor being interposed between an input of said first inverter and the ground.

23. The circuit according to claim 19, further comprising an additional transistor of a second polarity interposed between an output of said first inverter and said actual supply voltage, said additional transistor being adapted to prevent rapid re-switching of the pre-charge end signal emitted by said first inverter.

24. The circuit according to claim 19, wherein said first inverter comprises a transistor of a first polarity and a transistor of a second polarity.

25. The circuit according to claim 19, wherein each transistor of the first polarity is of an N-channel type and each transistor of the second polarity is of a P-channel type.

* * * * *